(12) United States Patent
Kurachi

(10) Patent No.: US 6,356,479 B1
(45) Date of Patent: Mar. 12, 2002

(54) SEMICONDUCTOR MEMORY SYSTEM

(75) Inventor: Ikuo Kurachi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/722,453

(22) Filed: Nov. 28, 2000

(30) Foreign Application Priority Data

Jun. 5, 2000 (JP) ........................................ 2000-167070

(51) Int. Cl.[7] .............................................. G11C 16/04
(52) U.S. Cl. ............................ 365/185.18; 365/185.27; 365/185.29
(58) Field of Search ...................... 365/185.18, 185.24, 365/185.27, 185.29, 185.33

(56) References Cited

U.S. PATENT DOCUMENTS 5,168,465 A * 12/1992 Harari ........................... 257/320
5,295,107 A *  3/1994 Okazawa et al. ........... 365/185.3
5,619,450 A *  4/1997 Takeguchi ................. 365/185.23

FOREIGN PATENT DOCUMENTS

JP          10-335502       12/1998
JP          10-335503       12/1998

* cited by examiner

Primary Examiner—Son Mai
(74) Attorney, Agent, or Firm—Volentine Francos, PLLC

(57) ABSTRACT

A pulse voltage with its frequency set at approximately 1 MHz and achieving a level of approximately 1V on the high level side and a level of −5∼−7V on the low level side is applied to the P-type well 123. When 1V is applied to a P-type well 123, the resulting forward bias causes electrons to be injected from a source 116 and a drain 117 into the channel (P-type well 123) (a). As the voltage applied to the P-type well 123 changes to −5 V, a depletion layer 124 is formed at the channel. At the depletion layer 124, the electrons are accelerated toward a tunnel oxide film 111 (b). The electrons having been accelerated in the channel are injected into the tunnel oxide film 111, are allowed to move inside the tunnel oxide film 111 by the electrical field at the tunnel oxide film 111 and are finally trapped at a floating gate 113. Thus, a semiconductor memory system that makes it possible to reduce the size of the memory cells, prevents erroneous data write/read and achieves a reduction in power consumption is provided.

1 Claim, 10 Drawing Sheets

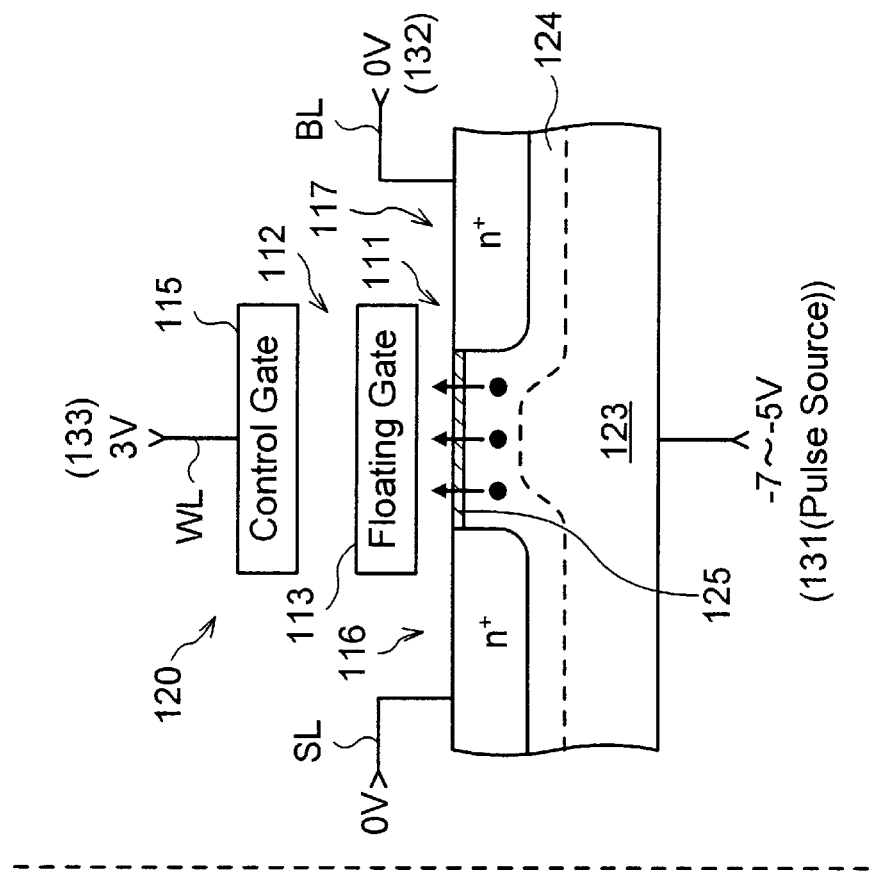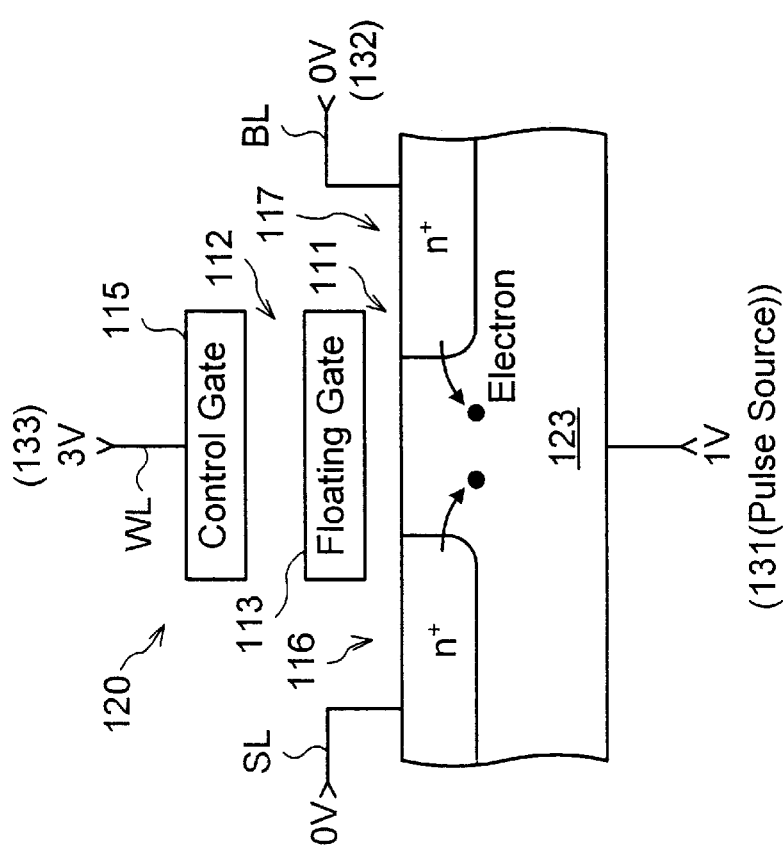
FIG.3(a)
FIG.3(b)

SEMICONDUCTOR MEMORY SYSTEM

BACKGROUND OF THE INVENTION

1. Field of the Invention

The present invention relates to a semiconductor memory system.

2. Description of the Related Art

FIG. 10 illustrates a flash memory 1 representing a semiconductor memory system in the prior art. This flash memory 1 stores information by varying the threshold voltage of the MOSFETs constituting individual memory cells. The threshold voltage of a MOSFET is adjusted by injecting electrons into a floating gate 13 provided between a tunnel oxide film 11 and an insulating film 12 and constituted of poly-crystalline silicon and drawing electrons from the floating gate 13.

Under normal circumstances, an F-N (Fowler-Nordheimt) tunnel current is generated at the tunnel oxide film 11 by applying a specific electrical field to the tunnel oxide film 11 or channel hot electrons that pass through the tunnel oxide film 11 are generated by engaging the MOSFET in operation, to inject electrons into the floating gate 13.

Electrons are drawn out from the floating gate 13, on the other hand, by using an F-N tunnel current between the drain and the floating gate 13 or an F-N tunnel current between the floating gate 13 and a P-type substrate 21.

However, the flash memory 1 in the prior art necessitates a high voltage to be applied to the tunnel oxide film 11 in order to ensure that a sufficient F-N tunnel current is applied to the tunnel oxide film 11 during a data write/erase operation at the memory cell.

In addition, positive holes are also injected into the floating gate 13 as electrons are injected into the floating gate 13 by using an F-N tunnel current. As data are overwritten repeatedly, the difference between the threshold voltage for a data write and the threshold voltage for a data erase becomes smaller, posing the risk of an erroneous data write/read.

It is necessary to fully turn on the MOSFET to inject electrons into the floating gate 13 by generating channel hot electrons, and even then, only so-called lucky hot electrons in the channel, are actually injected. As a result, the injection in efficiency with which electrons are injected relative to the current is low, causing difficulty in achieving a reduction in the power consumption at the flash memory 1.

In addition, the following problem is yet to be addressed in the flash memory 1 in the prior art with regard to system scale reduction. The coupling rate of the electrostatic capacity between the substrate 21 and the floating gate 13 and the electrostatic capacity between the floating gate 13 and a control gate 15 constituted of poly-crystalline silicon is a crucial factor in obtaining the electrical field necessary to supply a sufficient F-N tunnel current to the tunnel oxide film 11. In more specific terms, an electrostatic capacity which is sufficiently large relative to the electrostatic capacity between the substrate 21 and the floating gate 13 must be assured between the floating gate 13 and the control gate 15. Consequently, it is difficult to reduce the memory cell size by minimizing the area occupied by the floating gate 13.

SUMMARY OF THE INVENTION

An object of the present invention, which has been completed by addressing the problems discussed above, is to provide a semiconductor memory system which makes it possible to reduce the memory cell size, prevent an erroneous data write/read and achieve a reduction in power consumption.

In order to achieve the object described above, in a first aspect of the present invention, a semiconductor memory system having a plurality of memory cells and a decoder that selects one or more memory cells from the plurality of memory cells is provided. The individual memory cells provided in the semiconductor memory system each comprise a channel portion constituted of a semiconductor, a source portion constituted of a semiconductor, a drain portion constituted of a semiconductor, a control gate portion and a floating gate portion that is in an electrically suspended state between the channel portion and the control gate portion. In the semiconductor memory system in which one or more memory cells are selected from the plurality of memory cells by the decoder, a reference voltage is applied to the source portion, the reference voltage is applied to the drain portion, a first voltage at a level higher than the level of the reference voltage is applied to the control gate portion and a second voltage at a level higher than the level of the reference voltage and lower than the level of the first voltage and a third voltage at a level lower than the level of the reference voltage are alternately applied to the channel portion at each selected memory cell.

In the semiconductor memory system structured as described above, in which the channel portion, the source portion and the drain portion of a selected memory cell may be respectively constituted of a P-type semiconductor, an N-type semiconductor and an N-type semiconductor, the pn junction formed by the drain portion and the channel portion enters a foreword bias state when the second voltage is applied to the channel portion, and, as a result, electrons are injected into the channel portion from the drain portion. When the third voltage is applied to the channel portion, the pn junction formed by the source portion and the channel portion and the pn junction formed by the drain portion and the channel portion both enter a reverse bias state, which results in a depletion layer manifesting at the channel portion. The electrons in the channel are accelerated at the depletion layer and move into an insulated area located between the channel portion and the floating gate portion. In addition, when the third voltage is applied to the channel portion, an electrical field is generated between the floating gate portion and the channel portion by the potential difference between the control gate portion and the channel portion. This electrical field causes the electrons, which have moved into the insulated area between the channel portion and the floating gate portion to become injected into the floating gate portion. It is to be noted that if the channel portion, the source portion and the drain portion are respectively constituted of an N-type semiconductor, a P-type semiconductor and a P-type semiconductor, positive holes are injected into the channel portion to travel to the floating gate portion.

In the semiconductor memory system m a second aspect of the present invention, in which one or more memory cells are selected by the decoder from the plurality of memory cells, a reference voltage is applied to the source portion, a fourth voltage at a level higher than the level of the reference voltage is applied to the control gate portion, a fifth voltage at a level lower than the level of the reference voltage is applied to the channel portion and a sixth voltage at a level lower than the level of the fifth voltage is applied to the drain portion at each selected memory cell.

In the semiconductor memory system structured as described above, the pn junction formed by the drain portion and the channel portion enters a foreword bias state at a selected memory cell and, as a result, electrons are injected into the channel portion from the drain portion. The pn junction formed by the source portion and the channel portion on the other hand, enters a reverse bias state, which results in a depletion layer manifesting at the channel portion. The electrons in the channel are accelerated at the depletion layer and move into an insulated area located between the channel portion and the floating gate portion. In addition, an electrical field is generated between the floating gate portion and the channel portion by the potential difference between the control gate portion and the channel portion. This electrical field causes the electrons, which have moved into the insulated area between the channel portion and the floating gate portion, to become injected into the floating gate portion.

In addition, in the semiconductor memory system according to the present invention, in which there is one or more unselected memory cells that have not been selected by the decoder among the plurality of memory cells, a seventh voltage is applied to the control gate portion and the channel portion of each unselected memory cell. Since no potential difference manifests between the control gate portion and the channel portion at an unselected memory cell in the semiconductor memory system, no electrical field is generated between the floating gate portion and that channel portion. Thus, injection of electrons into the floating gate portion of an unselected memory cell is prevented. In addition, by roughly equalizing the level of the seventh voltage to the level of the fifth voltage, a common source can be utilized.

Alternatively, in the semiconductor memory system according to the present invention in which there is one or more unselected memory cells that have not been selected by the decoder among the plurality of memory cells, an eighth voltage at a level equal to or higher than the level of the voltage applied to the channel portion is applied to the drain portion of each unselected memory cell. Since the pn junction between the drain portion and the channel portion is set in an unbiased state or a reverse bias state at an unselected memory cell in this semiconductor memory system, electrons are not injected from the drain portion into the channel portion. As a result, injection of electrons into the floating gate portion is prevented at the unselected memory cell. In addition, by roughly equalizing the level of the eighth voltage to the level of the reference voltage, a common source can be utilized.

In the semiconductor memory system in a third aspect of the present invention, in which one or more memory cells are selected by the decoder from the plurality of memory cells, a ninth voltage at a level higher than the level of the reference voltage is applied to the control gate portion, a tenth voltage at a level lower than the level of the reference voltage is applied to the channel portion, an eleventh the voltage at a level lower than the level of the tenth voltage and the reference voltage are alternately applied to the source portion and a twelfth voltage at a level lower than the level of the tenth voltage and the reference voltage are alternately applied to the drain portion at each selected memory cell.

In the semiconductor memory system adopting the structure described above, when the eleventh voltage is applied to the source portion at a selected memory cell, the pn junction formed by the source portion and the channel portion enters a forward bias state and, as a result, electrons are injected into the channel portion from the source portion. Likewise, when the twelfth voltage is applied to the drain portion at the selected memory cell, the pn junction formed by the drain portion and the channel portion enters a forward bias state and, as a result, electrons are injected into the channel portion from the drain portion. When the reference voltage is applied to the source portion and the drain portion, the pn junction formed by the source portion and the channel portion and the pn junction formed by the drain portion and the channel portion both enter a reverse bias state, resulting in a depletion layer manifesting at the channel portion. The electrons in the channel are accelerated at the depletion layer and move into an insulated area located between the channel portion and the floating gate portion. In addition, an electrical field is generated between the floating gate portion and the channel portion by the potential difference between the control gate portion and the channel portion. This electrical field causes the electrons that have moved to into the insulating area between the channel portion and the floating gate portion to be injected into the floating gate portion.

In the semiconductor memory system in a fourth aspect of the present invention, in which one or more memory cells are selected by the decoder from the plurality of memory cells, a thirteenth voltage at a level higher than the level of the reference voltage is applied to the control gate portion, a fourteenth voltage at a level lower than the level of the reference voltage is applied to the channel portion, the reference voltage is applied to the source portion and a fifteenth voltage at a level lower than the level of the fourteenth voltage and the reference voltage are alternately applied to the drain portion at each selected memory cell.

In the semiconductor memory system adopting the structure described above, when the fifteenth voltage is applied to the drain portion at a selected memory cell, the pn junction formed by the drain portion and the channel portion enters a forward bias state and, as a result, electrons are injected into the channel portion from the drain portion. When the reference voltage is applied to the drain portion, the pn junction formed by the source portion and the channel portion and the pn junction formed by the drain portion and the channel portion both enter a reverse bias state, resulting in a depletion layer manifesting at the channel portion. The electrons in the channel are accelerated at the depletion layer and move into an insulated area located between the channel portion and the floating gate portion. In addition, an electrical field is generated between the floating gate portion and the channel portion by the potential difference between the control gate portion and the channel portion. This electrical field causes the electrons that have moved to into the insulating area between the channel portion and the floating gate portion to be injected into the floating gate portion.

In addition, in the semiconductor memory system according to the present invention, in which there is one or more unselected memory cells that have not been selected by the decoder among the plurality of memory cells, a sixteenth voltage is applied to the control gate portion and the channel portion of each unselected memory cell. Since no potential difference manifests between the control gate portion and the channel portion at an unselected memory cell in the semiconductor memory system, no electrical field is generated between the floating gate portion and that channel portion. Thus, injection of electrons into the floating gate portion of the unselected memory cell is prevented. In addition, by roughly equalizing the level of the sixteenth voltage to the level of the fourteenth voltage, a common source can be utilized.

Alternatively, in the semiconductor memory system according to the present invention in which there is one or more unselected memory cells that have not been selected by the decoder among the plurality of memory cells, a seventeenth voltage at a level equal to or higher than the level of the voltage applied to the channel portion is applied to the drain portion of each unselected memory cell. Since the pn junction between the drain portion and the channel portion is set in an unbiased state or a reverse bias state at an unselected memory cell in this semiconductor memory system, electrons are not injected from the drain portion into the channel portion. As a result, injection of electrons into the floating gate portion is prevented at the unselected memory cell. In addition, by roughly equalizing the level of the seventeenth voltage to the level of the reference voltage, a common source can be utilized.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings:

FIG. 3, consisting of FIGS. 3A and 3B, is a sectional view illustrating the movement of electrons in the memory cell in FIG. 2;

DETAILED DESCRIPTION OF THE PREFERRED EMBODIMENTS

The following is a detailed explanation of preferred embodiments of the semiconductor memory system according to the present invention, given in reference to the attached drawings. It is to be noted that in the following explanation and the attached drawings, the same reference numbers are assigned to components achieving roughly identical functions and structural features to preclude the necessity for repeated explanation thereof.
(First Embodiment)

Figure 1:
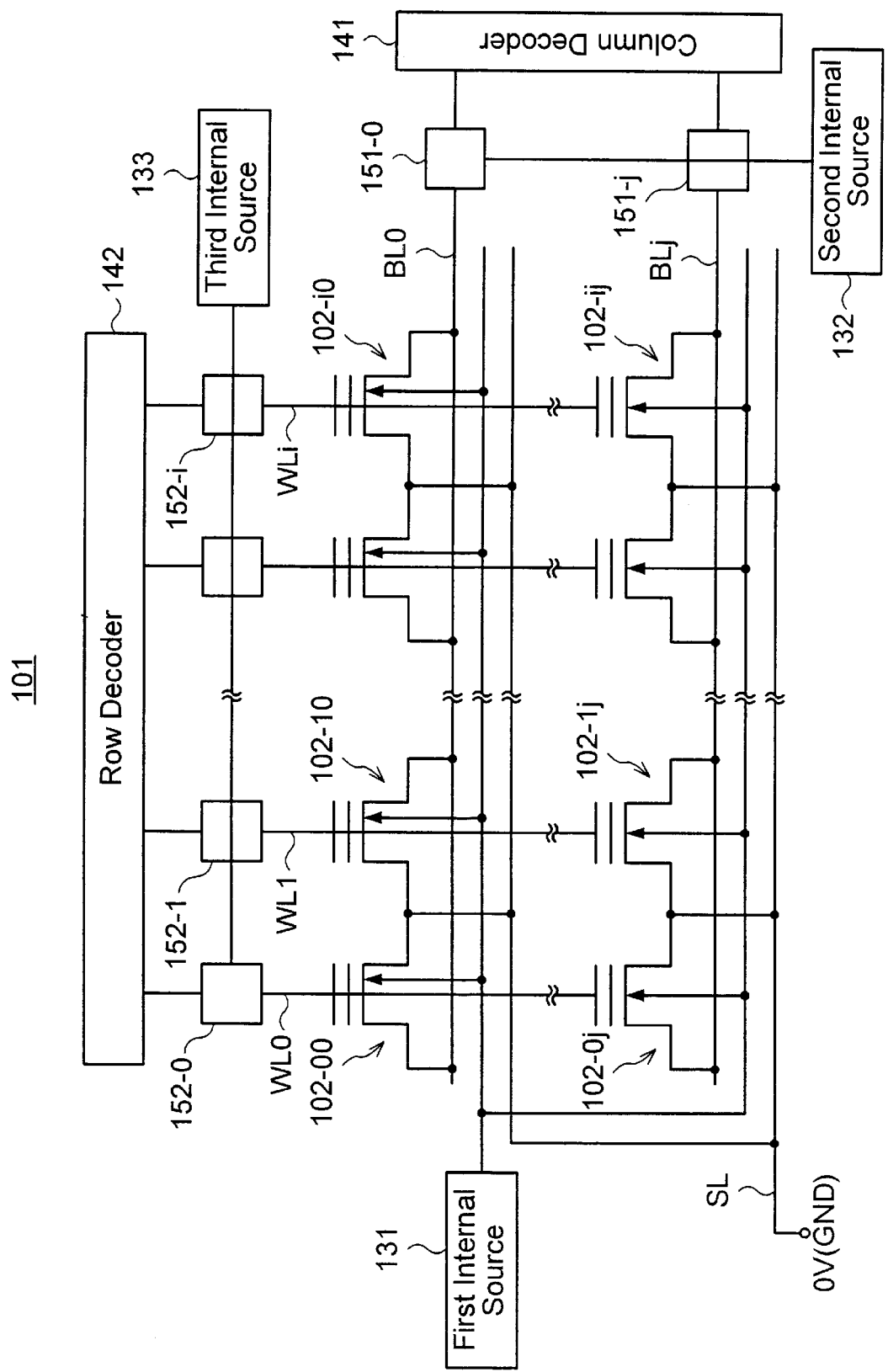
FIG. 1 is a circuit block diagram illustrating the structure of the flash memory in a first embodiment of the present invention.
Figure 2:
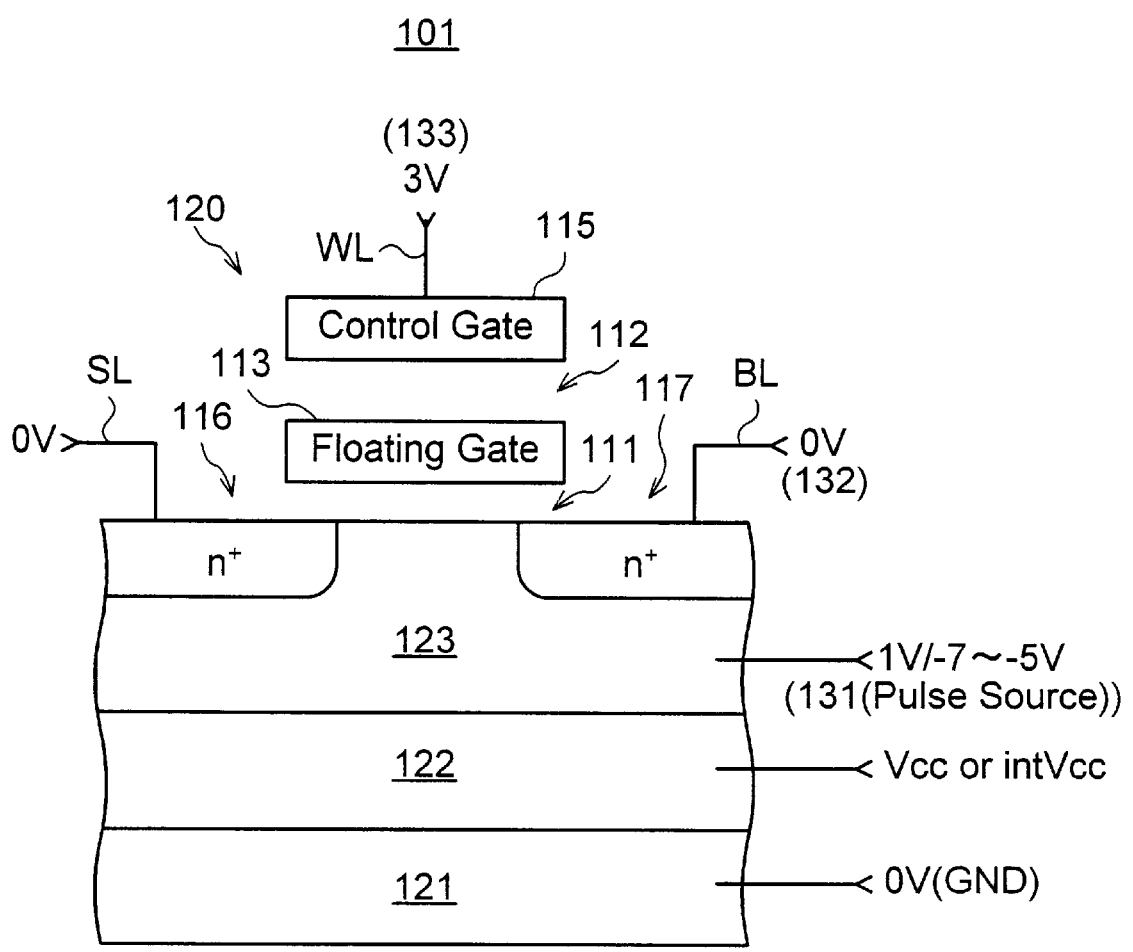
FIG. 2 is a sectional view of a memory cell provided in the flash memory in FIG. 1.

A flash memory 101 in the first embodiment of the present invention is now explained in reference to FIGS. 1, 2 and 3.

The flash memory 101 is provided with a memory cell array constituted of a plurality of stacked type memory cells 102-00~102-ij, as illustrated in FIG. 1. In addition, as shown in FIG. 2, the flash memory 101 is provided with an N-type well 122 located on a P-type substrate 121 and a plurality of P-type wells 123 located inside the N-type well 122. The memory cells 102-00~102-ij, which are formed inside one of the P-type wells 123 are electrically isolated from one another.

The memory cells 102-00~102-ij are structured roughly identical to one another. FIG. 2 presents a sectional view of the structure. The memory cells 102 (102-00~102-ij) are each provided with a stacked type gate constituted of a floating gate 113 and a control gate 115, a source 116 and a drain 117 formed on the two sides of the stacked type gate and a channel (a P-type well 123) located between the source 116 and the drain 117.

The source 116 and the drain 117 each constitutes an $n^+$ diffusion area formed by doping N-type impurities at a high concentration. The floating gate 113, which is constituted of poly crystalline silicon, is formed on the channel (P-type well 123) via a tunnel oxide film 111 (film thickness 7~9 nm). It is to be noted that the floating gate 113 partially overlaps the source 116 and the drain 117. The control gate 115, which is constituted of poly crystalline silicon as is the floating gate 113, is formed over the floating gate 113 via an insulating film (an oxide film or an oxide film/nitride film/oxide film) 112.

The P-type substrate 121 is connected to a ground GND. A source potential Vcc or an internal source potential intVcc is applied to the N-type well 122. The P-type well 123 is connected to a first internal source 131, the drain 117 is connected to a second internal source 132 via a bit line BL and a bit line driver 151. The control gate 115 is connected to a third internal source 133 via the corresponding word line WL and a word line driver 152 and the source 116 is connected to the ground GND via a source line SL.

The operation of the flash memory 101 in the first embodiment structured as described above is now explained.

First, the operation of a given memory cell 102 among the plurality of memory cells 102-00~102-ij provided in the flash memory 101, and in particular, the electron injection mechanism with which electrons are injected into the floating gate 113 at the memory cell 102, are explained in reference to FIG. 3. It is to be noted that while the threshold voltage of the transistor in the memory cell 102 rises when electrons are injected into the floating gate, the rise of the threshold voltage corresponds to either a data erase operation or a data write operation depending upon the specifications of the flash memory 11.

To inject electrons to the floating gate 113 provided in the memory cell 102, various voltages are applied to the individual components as detailed below.

A pulse voltage having a frequency of approximately 1 MHz, with its level on the high level side at approximately 1V and on the low level side at −5~7V, is applied from the first internal source 131 to the P-type well 123.

0V is applied to the drain 117 from the second internal source 132 via the bit line BL.

3V is applied to the control gate 115 from the third internal source 133 via the word line WL.

0V (ground GND voltage) is applied to the source 116 as mentioned earlier.

Since the source 116 and the drain 117 each constitutes an $n^+$ diffusion area, a pn junction is formed between the source 116 and the P-type well 123 and also between the drain 117 and the P-type well. With the voltage levels at the source 116 and the drain 117 fixed at 0V, the forward bias achieved by applying the 1V pulse voltage to the P-type well 123 causes electrons (minority carriers) to be injected into the channel (P-type well 123) from the source 116 and the drain 117 (see FIG. 3(a)).

When the pulse voltage applied to the P-type well 123 changes to −5 V, a depletion layer 124 is formed at the channel. In this depletion layer 124, electrons are accelerated toward the tunnel oxide film 111 (see FIG. 3b).

If the P-type well 123 is biased toward the negative side, an inversion layer 125 manifests at the channel surface, and, as a result, the potential at the channel surface shifts to 0V as at the source 116 and the drain 117. Thus, assuming that the film thickness of the tunnel oxide film 111 is 9 nm and the coupling rate is 0.7, the electrical field generated at the tunnel oxide film 111 is $1\sim 3\times 10^8$V/m with a potential at the control gate 115 adjusted at 3V.

The electrons accelerated in the channel gain enough energy to overcome the energy barrier present at the interface of the channel (silicon) and the tunnel oxide film 111 and are injected into the tunnel oxide film 111. Subsequently, the electrons are caused to move inside the tunnel oxide film 111 by the electrical field $1\sim 3\times 10^8$V/m at the tunnel oxide film 111 and become trapped at the floating gate 113. Thus, the electrons, i.e. a negative charge is accumulated at the floating gate 113, to raise the threshold voltage of the transistor constituting the memory cell 102.

Electrons are injected into the floating gate 113 through the mechanism described above. Extraction of electrons from the floating gate 113, on the other hand, is implemented as described below.

A negative voltage is applied to the control gate 115 from the third internal source 133 and a positive voltage is applied to the drain 117 from the second internal source 132. This generates an F-N tunnel current at the tunnel oxide film 111 flow from the drain 117 to the floating gate 113, thereby causing electrons accumulated at the floating gate 113 to flow out to the drain 117. With the electrons flowing out of the floating gate 113, the threshold voltage of the transistor constituting the memory cell 102 becomes lowered.

As explained above, the threshold voltage of the transistor constituting the memory cell 102 is raised/lowered by injecting electrons into the floating gate 113 and extracting electrons from the floating gate 113. Adjusting the threshold voltage at a specific level constitutes a write operation for writing data "0" or "1" in the memory cell 102 or a data erase operation for erasing data from the memory cell 102. It is to be noted that data read from the memory cell 102 is performed by detecting the drain current which changes in correspondence to the threshold voltage.

Figure 10:
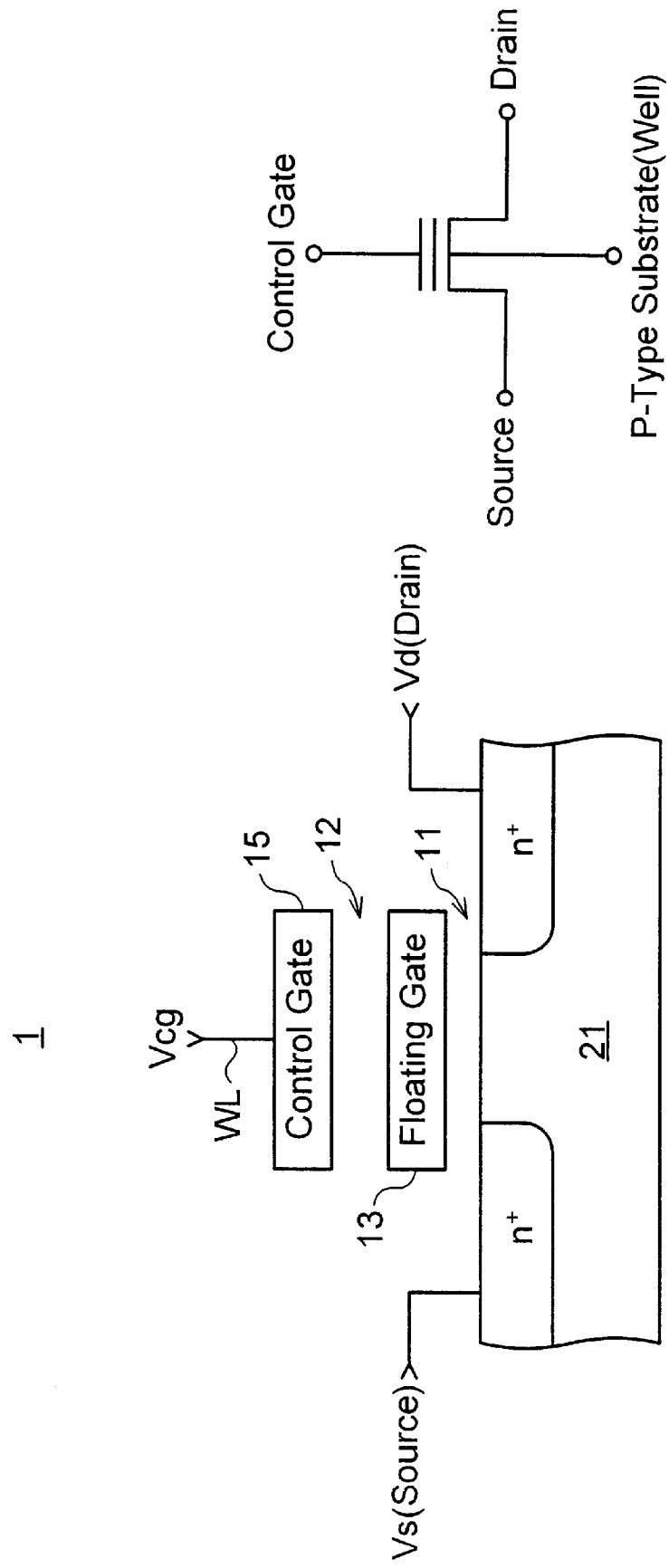
FIG. 10 is a sectional view of a memory cell provided in a flash memory in the prior art.

In the flash memory 1 in the prior art illustrated in FIG. 10, assuming that the coupling rate is 0.7 and the film thickness of the tunnel oxide film 11 is 9 nm, an electrical field at $10\sim 12\times 10^8$V/m must be generated at the tunnel oxide film 11 by applying a voltage of approximately 15 V to the control gate 15 in order to inject electrons into the floating gate 13.

In the flash memory 101 in the first embodiment, in which a pulse voltage is applied to the P-type well 123, electrons are injected efficiently into the floating gate 113 even if the voltage applied to the control gate 115 is low and, consequently, the electrical field at the tunnel oxide film 111 is small. In other words, the flash memory 101 in the first embodiment achieves a reduction in the power required to inject electrons into the floating gate compared to the power required in the flash memory 1 in the prior art.

In addition, since electrons can be injected into the floating gate 113 even when the electrical field at the tunnel oxide film 111 is small, it is not necessary to assure as large an electrostatic capacity between the floating gate 113 and the control gate 115 relative to the electrostatic capacity between the P-type well 123 and the floating gate 113 as in the prior art. Thus, the size of the memory cell 102 can be reduced with ease.

Furthermore, the flash memory 1 in the prior art poses the following problem. As described earlier, it is necessary to generate a $10\sim 12\times 10^8$V/m electrical field at the tunnel oxide film 11 in order to inject electrons into the floating gate 13 in the flash memory 1 in the prior art. Such a large electrical field causes electrons present inside the tunnel oxide film 11 or the floating gate 13 to move as well as the electrons injected into the tunnel oxide film 11 from the channel. As a result, numerous positive holes are formed inside the tunnel oxide film 11. Since the positive holes formed at the tunnel oxide film 11 constitutes traps where the electrons injected from the channel become trapped, full injection of electrons into the floating gate 13 is disabled. Consequently, the threshold voltage does not rise to a specific level to result in a risk of a data write failure or a data erase failure.

By utilizing the flash memory 101 in the first embodiment, however, the electrical field at the tunnel oxide film 111 can be reduced to inject electrons into the floating gate 113 so that the occurrence of positive holes inside the tunnel oxide film 111 can be minimized. Thus, a high degree of reliability is achieved with regard to data write/data erase.

The mechanism through which electrons are injected into the floating gate 113 in a given memory cell 102 among the plurality of memory cells 102-00~102-ij has been explained. This electron injection mechanism is employed in all the memory cells 102-00~102-ij. In addition, by constituting the flash memory 101 in the first embodiment as illustrated in FIG. 1, electrons can be injected into the floating gates provided at the individual memory cells 102-00~102-ij at once.

In reference to FIG. 1, the connections of the individual memory cells 102-00~102-ij to their peripheral circuits in the flash memory 101 in the first embodiment are explained.

The sources of the memory cells 102-00~102-ij are commonly connected to the ground GND (0V) via a source line SL.

The channels (P-type wells) of the memory cells 102-00~102-ij are commonly connected to the first internal source 131.

The drains of the memory cells 102-00~102-ij are connected to bit lines BL0~BLj. A bit line selection is made from the bit lines BL0~BLj by a column decoder 141. A selected bit line is connected to the second internal source 132 via the corresponding bit line driver among bit line drivers 151-0~151-j.

The control gates of the memory cells 102-00~102-ij are connected to word lines WL0~WLi. A bit line selection is made from the word lines WL0~WLi by a column decoder 142. A selected word line is connected to the third internal source 133 via the corresponding word line driver among word line drivers 152-0~152-i.

By selecting all the memory cells 102-00~102-ij with the column decoder 141 and the row decoder 142 in the flash memory 101 structured as described above, electrons are injected into the floating gates of the individual memory cells 102-00~102-ij through the mechanism illustrated in FIG. 3, to raise the threshold voltages of the transistors constituting the memory cells 102-00~102-ij at once. For instance, if the flash memory 101 is a type that erases stored data by raising the threshold voltages of the transistors constituting the memory cells 102-00~102-ij to a specific level, the circuit structure illustrated in FIG. 2 may be adopted to erase data stored in all the memory cells 102-00~102-ij in a batch.

(Second Embodiment)

A flash memory 201 in the second embodiment of the present invention is provided with a memory cell array constituted of a plurality of stacked type memory cells 102-00~102-ij, as is the flash memory 101 in the first embodiment.

In the flash memory 201, various voltages (to be detailed later) are applied to individual components of the memory cells 102-00~102-ij to inject electrons into the floating gates of the individual memory cells 102-00~102-ij. The various voltages applied to a given memory cell 102 among the memory cells 102-00~102-ij and the injection mechanism, through which electrons are injected into the floating gate 113 of the memory cell 102 are now explained in reference to FIG. 4.

A constant voltage at −5~−7V is applied to the P-type well 123 from a first internal source 231.

A voltage that is lower than the voltage applied to the P-type well 123 by approximately 1V is applied to the drain 117 from a second internal source 232 via a bit line BL. For instance, if the voltage applied to the P-type well 123 is −5 V, −6 V is applied to the drain 117.

A 3V voltage (if the coupling rate is approximately 0.7) is applied to the control gate 115 from the third internal source 133 via the corresponding word line WL so as to generate a $1{\sim}3{\times}10^8$V/m electrical field at the tunnel oxide film 111.

A voltage of 0V (ground GND voltage) is applied to the source 116.

Since the potential at the drain 117 is lower than the potential at the P-type well 123 by 1V at the memory cell 102, the pn junction formed between the drain 117 and the P-type well 123 is set in a forward bias state. Thus, electrons (minority carriers) are injected from the drain 117 into the channel (P-type well 123).

The pn junction formed between the source 116 and the P-type well 123, on the other hand, is in a reverse bias state, with a depletion layer 124 spreading from the area below the source 116 to the channel.

The electrons injected into the channel from the drain 117 travel to the depletion layer 124 where they become accelerated. The accelerated electrons gain enough energy to overcome the energy barrier present at the interface of the channel (silicon) and the tunnel oxide film 111 and are injected into the tunnel oxide film 111. Subsequently, the electrons are caused to move inside the tunnel oxide film 111 by the electrical field $1{\sim}3{\times}10^8$V/m at the tunnel oxide film 111 and become trapped at the floating gate 113. Thus, the electrons, i.e. a negative charge is accumulated at the floating gate 113, to raise the threshold voltage of the transistor constituting the memory cell 102.

Electrons are injected into the floating gate 113 through the mechanism described above. Electrons are drawn out from the floating gate 113 in an almost identical manner to that in which electrons are drawn out in the flash memory 101 in the first embodiment.

As explained above, the flash memory 201 in the second embodiment achieves a reduction in the size, a reduction in the power consumption and an improvement in the reliability of data write/data erase, as does the flash memory 101 in the first embodiment. In addition, the flash memory 201 in the second embodiment, which, unlike the flash memory 101 in the first embodiment, does not require a pulse voltage to be applied to the P-type well 123, achieves simplification in the circuit structure of the voltage supply source (first internal source 231) that supplies a voltage to the P-type well 123.

As described above, the flash memory 201 in the second embodiment is provided with a plurality of memory cells 102-00~102-ij. In the flash memory 201 in the second embodiment, electrons can be injected into the floating gates provided at the individual memory cells 102-00~102-ij all at once, as in the flash memory 101 in the first embodiment. In addition, structuring the flash memory 201 as illustrated in FIG. 5, electrons can be injected into the floating gate(s) of one or more memory cells selected from the memory cells 102-00~102-ij.

Figure 5:
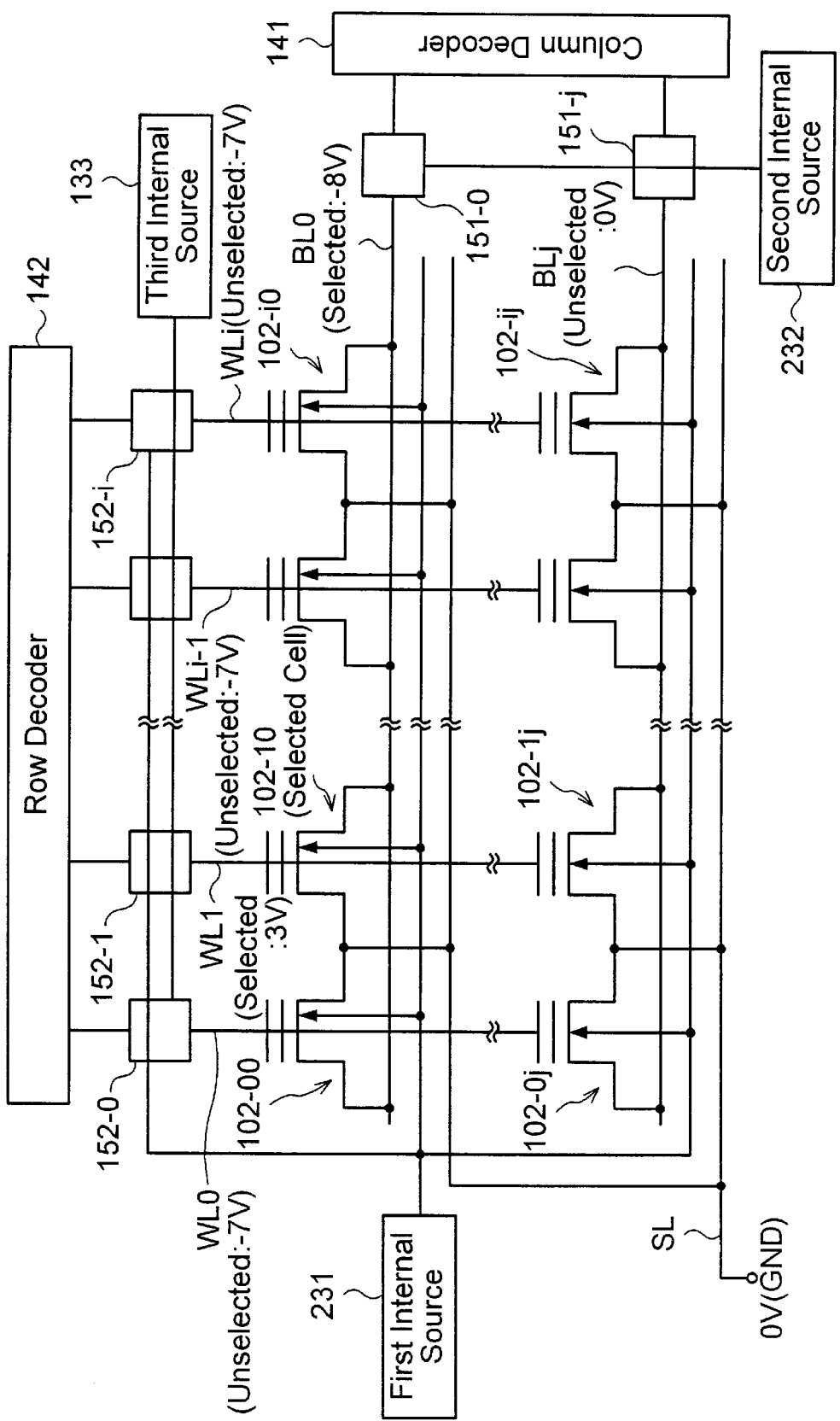
FIG. 5 is a circuit block diagram illustrating the structure of the flash memory in the second embodiment of the present invention.

In reference to FIG. 5, the connections of the individual memory cells 102-00~102-ij to their peripheral circuits in the flash memory 201 in the second embodiment are explained.

The sources of the memory cells 102-00~102-ij are commonly connected to the ground GND (0V) via the source line SL.

The channels (P-type wells) of the memory cells 102-00~102-ij are commonly connected to the first internal source 231.

The drains of the memory cells 102-00~102-ij are connected to bit lines BL0~BLj. A bit line selection is made from the bit lines BL0~BLj by the column decoder 141. A selected bit line is connected to the second internal source 232 via the corresponding bit line driver among the bit line drivers 151-0~151-j. Bit lines that have not been selected (unselected bit lines), on the other hand, are connected to the ground GND(0V) via the bit line drivers 151-0~151-j.

The control gates of the memory cells 102-00~102-ij are connected to word lines WL0~WLi. A word line selection is made from the word lines WL0~WLi by the row decoder 142. A selected word line is connected to the third internal source 133 via the corresponding word line driver among the word line drivers 152-0~152-i. The word lines that have not been selected (unselected word lines), on the other hand, are connected to the first internal source 231 via the word line drivers 152-0~152-i.

Now, the operations achieved in the individual memory cells 102-00~102-ij when the bit line BL0 is selected by the column decoder 141 and the word line WL1 is selected by the row decoder 142 in order to inject electrons into the floating gate of the memory cell 102-10, for instance, in the flash memory 201 structured as described above are now explained.

First, the operation of the memory cell 102-10 (selected memory cell) at the address specified by the selected bit line, i.e., the bit line BL0, and the selected word line, i.e., the word line WL1, is explained.

0V (ground GND voltage) is applied to the source of the memory cell 102-10 via the source line SL whereas −7V output from the first internal source 231 is applied to the channel (P-type well ) of the memory cell 102-10. Since the row decoder 142 has selected the word line WL1, 3V output from the third internal source 133 is applied to the control gate of the memory cell 102-10 connected to the word line WL1 via the word line driver 152-1 and the word line WL1. In addition, with the bit line BL0 having been selected by the column decoder 141, −8V (a voltage lower than a voltage output from the first internal source 231 and applied to the channel by approximately 1V) output from the second internal source 232 is applied to the drain of the memory cell 102-10 connected to the bit line BL0 via the bit line driver 151-0 and the bit line BL0.

Figure 4:
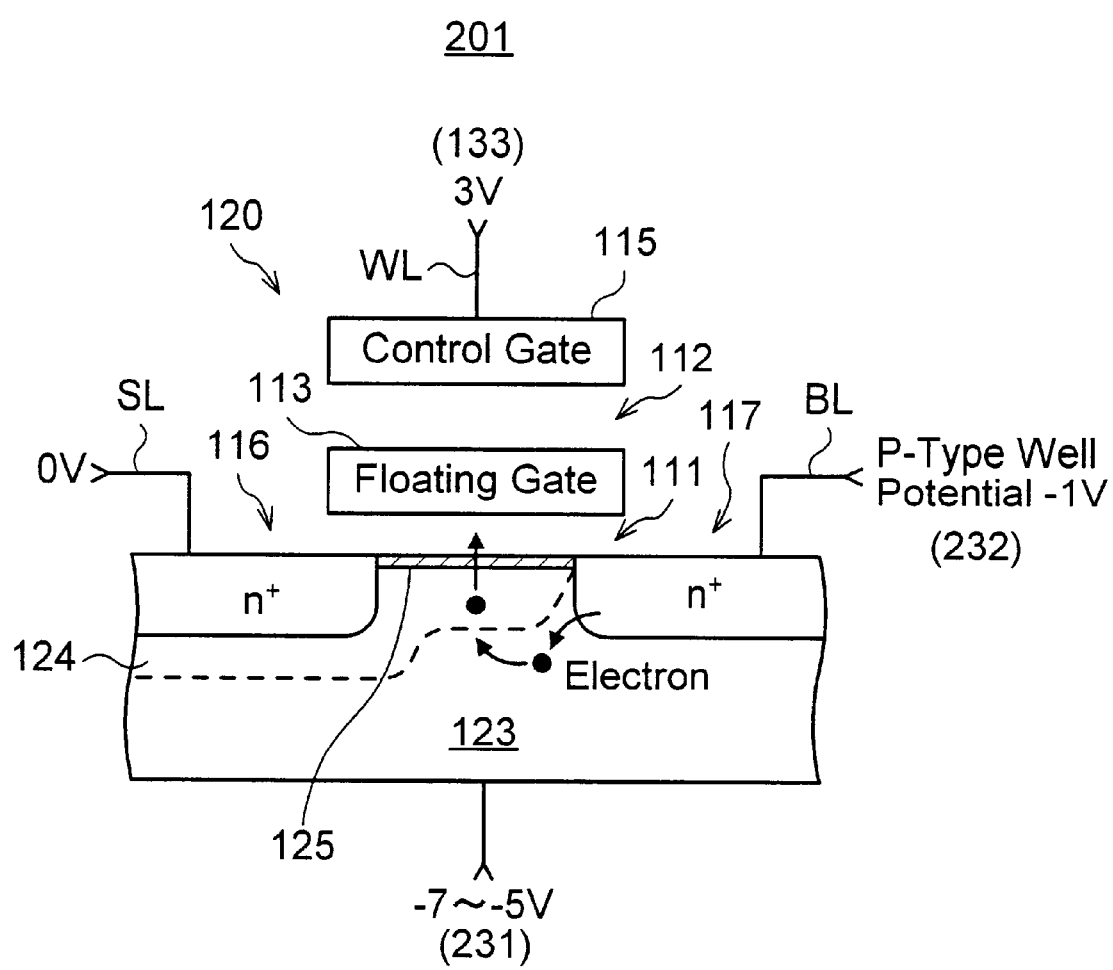
FIG. 4 is a sectional view of a memory cell provided in the flash memory in a second embodiment of the present invention.

With specific voltages applied to individual components thereof, as described above, the memory cell 102-10 engages in an operation similar to that performed by the memory cell 102 shown in FIG. 4. Namely, in the memory cell 102-10, electrons are injected from its drain to its channel, and the electrons thus injected are accelerated at the depletion layer. Then the electrons gain enough energy to overcome the energy barrier present at the interface of the channel and the tunnel oxide film and are injected into the tunnel oxide film. Subsequently, the electrons travel inside the tunnel oxide film due to the presence of the electrical field $1\sim3\times10^8$V/m at the tunnel oxide film to become trapped at the floating gate. Thus, the electrons, i.e., a negative charge is accumulated at the floating gate of the memory cell 102-10 to raise the threshold voltage of the transistor constituting the memory cell 102-10.

Next, the operations of the memory cells (unselected memory cells) other than the selected memory cell, i.e., the memory cell 102-10, are explained.

The unselected memory cells are divided into three groups, i.e., (1) memory cells each connected to the selected bit line and an unselected word line, (2) memory cells each connected to an unselected bit line and the selected word line and (3) memory cells each connected to an unselected bit line and an unselected word line. The operations of the unselected memory cells in these three groups are now individually explained.

The memory cells in group (1) include, for instance, the memory cell 102-i0. 0V (ground GND voltage) is applied to the source of the memory cell 102-i0 via the source line SL, whereas −7V output from the first internal source 231 is applied to the channel (P-type well) of the memory cell 102-i0. Since the word line WLi has not been selected by the row decoder 142, −7V output from the first internal source 231 is applied to the control gate of the memory cell 102-i0 connected to the word line WLi via the word line driver 152-i and the word line WLi. Since the bit line BL0 has been selected by the column decoder 141, −8V (a voltage lower than the voltage output from the first internal source 231 and applied to the channel by approximately 1V) output from the second internal source 232 is applied to the drain of the memory cell 102-i0 connected to the bit line BL0 via the bit line driver 151-0 and the bit line BL0.

In this memory cell 102-i0, electrons are injected from its drain to its channel as in the selected memory cell 102-10. However, with −7V output from the first internal source 231 applied to its control gate and channel, the control gate and the channel achieve potentials equal to each other. As a result, no electrical field directed toward the floating gate is generated at the tunnel oxide film, and even when electrons are injected from the channel to the tunnel oxide film, the electrons do not move toward the floating gate. Thus, no electrons (no negative charge), are injected to the floating gate of the memory cell 102-i0, and the threshold voltage of the transistor constituting the memory cell 102-i0 remains unchanged.

The memory cells in group (2) include, for instance, the memory cell 102-1j. 0V (ground GND voltage) is applied to the source of the memory cell 102-1j via the source line SL, whereas −7V output from the first internal source 231 is applied to the channel (P-type well) of the memory cell 102-1j. Since the word line WL1 has been selected by the row decoder 142, 3V output from the third internal source 133 is applied to the control gate of the memory cell 102-1j connected to the word line WL1 via the word line driver 152-1 and the word line WL1. Since the bit line BLj has not been selected by the column decoder 141, 0V is applied to the drain of the memory cell 102-1j connected to the bit line BLj via the bit line driver 151-j and the bit line BLj.

In the memory cell 102-1j, an electrical field $1\sim3\times10^8$V/m is generated at the tunnel oxide film as in the selected memory cell, i.e., the memory cell 102-10. However, with the reverse bias achieved between its drain and its channel, the electrons to be injected into the floating gate are not injected from the drain to the channel in the first place. As a result, no electrons, i.e., no negative charges, are injected into the floating gate of the memory cell 102-1j, and the threshold voltage of the transistor constituting the memory cell 102-1j remains unchanged.

The memory cells in group (3) include, for instance, the memory cell 102-ij. 0V (ground GND voltage) is applied to the source of the memory cell 102-ij via the source line SL, whereas −7V output from the first internal source 231 is applied to the channel (P-type well) of the memory cell 102-ij. Since the word line WLi has not been selected by the row decoder 142, the −7V output from the first internal source 231 is applied to the control gate of the memory cell 102-ij connected to the word line WLi via the word line driver 152-i and the word line WLi. Since the bit line BLj has not been selected by the column decoder 141 either, 0V is applied to the drain of the memory cell 102-ij connected to the bit line BLj via the bit line driver 151-j and the bit line BLj.

In this memory cell 102-ij, a reverse bias is achieved between the drain and the channel and, as a result, electrons to be injected into the floating gate are not injected from the drain to the channel in the first place. In addition, −7V output from the first internal source 231 is applied to the control gate and the channel, thereby setting the control gate and the channel at potentials equal to each other and, as a result, no electrical field directed toward the floating gate is generated at the tunnel oxide film. Thus, no electrons, i.e., no negative electrical charge, is injected into the floating gate of the memory cell 102-ij, and the threshold voltage of the transistor constituting the memory cell 102-ij remains unchanged.

As described above, the flash memory 201 in the second embodiment allows a single memory cell (e.g., the memory cell 102-10) to be selected from the plurality of memory cells 102-00~102-ij so that electrons are injected only into the floating gate at the selected memory cell. In addition, the flash memory 201 in the second embodiment allows a plurality of memory cells corresponding to a given bit line or a given word line or all the memory cells to be selected. In any of these cases, electrons are injected into the floating gate of a selected memory cell alone, and no electrons are injected into the floating gates of unselected memory cells. For instance, if the flash memory 201 is a type of memory in which data are written by raising the threshold voltage of the transistors constituting the individual memory cells 102-00~102-ij to a specific level, the circuit structure illustrated in FIG. 5 may be adopted to enable a data write only at a specific memory cell.

It is to be noted that electrons may be drawn out of the floating gates of the individual memory cells all at once in the flash memory 201 in the second embodiment by applying a negative voltage to the control gates of the memory cells and applying 0V (ground GND voltage) to the drains, the sources and the channels (P-type wells), so that the threshold voltage of the transistors constituting the memory cells are lowered to a specific level. For instance, if the flash memory 201 is a type of memory in which stored data at the memory cells 102-00~102-ij are erased by lowering the threshold voltage of the transistors constituting the memory cells to a specific level, the circuit structure shown in FIG. 5 may be adopted to enable batch erasure of data stored in all the memory cells 102-00~102-ij.

(Third Embodiment)

Figure 6:
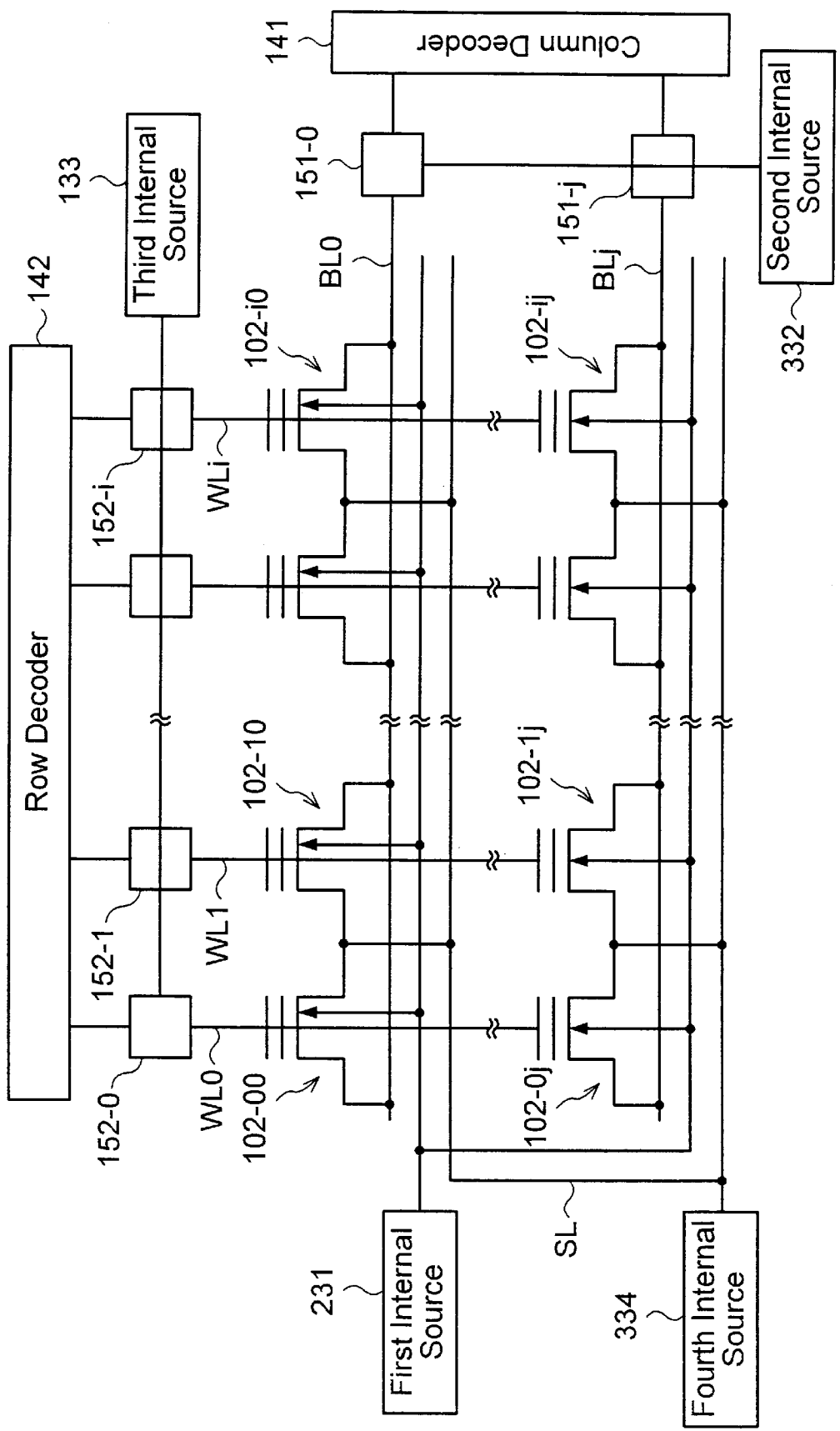
FIG. 6 is a circuit block diagram illustrating the structure of the flash memory in a third embodiment of the present invention.

A flash memory 301 in the third embodiment of the present invention is provided with a memory cell array constituted of a plurality of stacked type memory cells 102-00~102-ij, as is the flash memory 101 in the first embodiment, as illustrated in FIG. 6.

Figure 7B:
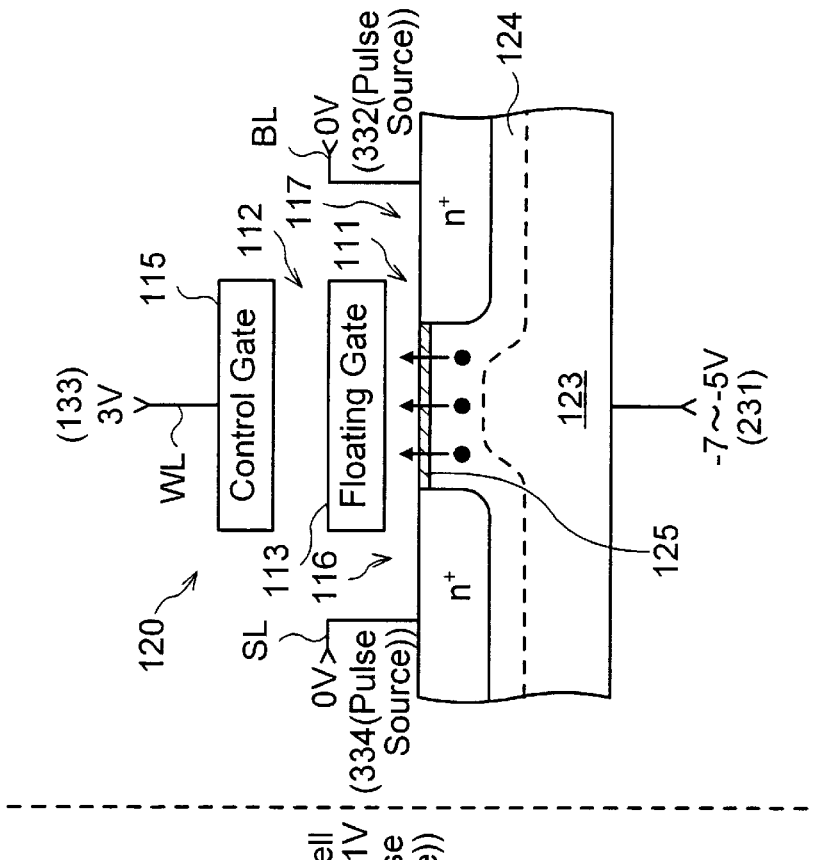
FIG. 7, consisting of FIGS. 7A and 7B, is a sectional view illustrating the movement of electrons in a memory cell provided in the flash memory in FIG. 6.
Figure 7A:
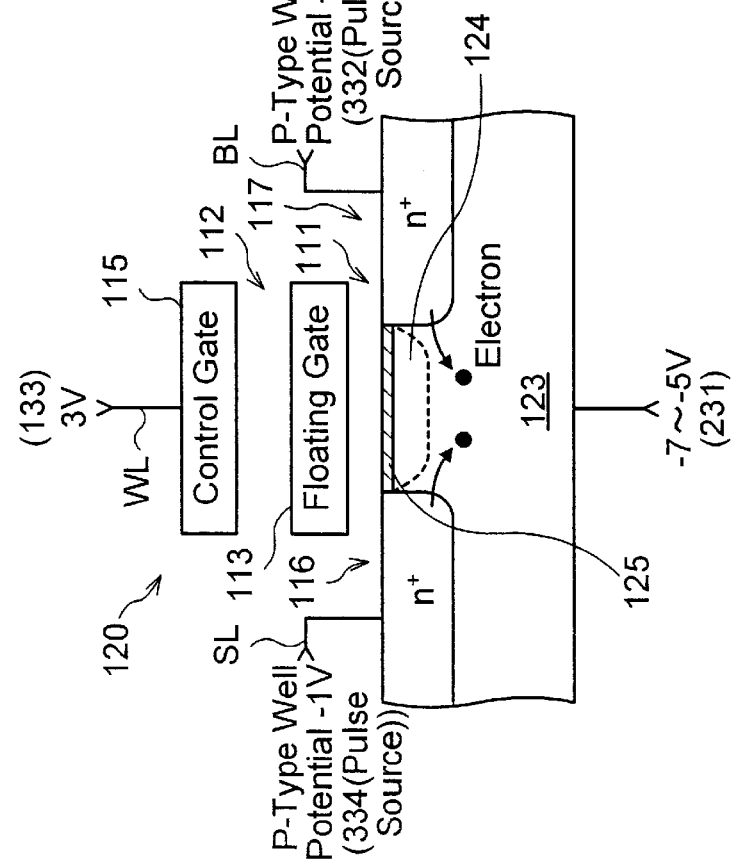

In the flash memory 301, various voltages (to be detailed later) are applied to individual components of the memory cells 102-00~102-ij to inject electrons into the floating gates of the individual memory cells 102-00~102-ij. The various voltages applied to a given memory cell 102 among the memory cells 102-00~102-ij and the injection mechanism through which electrons are injected into the floating gate 113 of the memory cell 102 are now explained in reference to FIG. 7.

A constant voltage at −5~−7V is applied to the P-type well 123 from the first internal source 231.

A pulse voltage is applied to the drain 117 from a second internal source 332 via the bit line BL.

A 3V voltage (if the coupling rate is approximately 0.7) is applied to the control gate 115 from the third internal source 133 via the corresponding word line WL so as to generate a $1\sim3\times10^8$V/m electrical field at the tunnel oxide film 111.

A pulse voltage is applied to the source 116 from a fourth internal source 334 via the source line SL.

Synchronization is achieved for the pulse voltage output from the second internal source 332 and applied to the drain 117 and the pulse voltage output from the fourth internal source 334 and applied to the source 116. Both these pulse voltages have their frequencies set at approximately 1 MHz and are adjusted to swing between a voltage which is lower than the voltage applied to the P-type well 123 by approximately 1V (−8V if −7V is applied to the P-type well 123) and 0V. It is to be noted that the second internal source 332 and the fourth internal source 334 may be constituted as an integrated unit.

First, let us consider a situation in which the potentials at the source 116 and the drain 117 are both lowered to a level lower than the potential at the P-type well 123 by 1V by the pulse voltages output from the second internal source 332 and the fourth internal source 334 respectively. In this situation, the pn junctions between the source 116 and the P-type well 123 and between the drain 117 and the P-type well 123 are set in a forward bias state. As a result, electrons (minority carriers) are injected from the source 116 and the drain 117 into the channel (P-type well 123) (see FIG. 7(a)).

Then, as the potentials the at the source 116 and the drain 117 are raised to 0V by the pulse voltages output from the second internal source 332 and the fourth internal source 334 respectively, the depletion layer 124 spreads over the entire range in the lower portion of the channel. At the depletion layer 124, the electrons injected from the source 116 and the drain 117 into the channel become accelerated toward the tunnel oxide film 111 (see FIG. 7(b)).

An inversion layer 125 having manifested at the channel surface sets the potential at the channel surface equal to the potentials at the source 116 and the drain 117, i.e., 0V at this time. Assuming that the film thickness of the tunnel oxide film 111 is 9 nm and the coupling rate is 0.7, the electrical field generated at the tunnel oxide film 111 is $1\sim3\times10^8$V/m with the potential at the control gate 115 adjusted at 3V. In addition, since there is no difference between the potential at the source 116 and the potential at the drain 117, no current flows between them (carriers do not move).

The electrons accelerated in the channel gain enough energy to overcome the energy barrier present at the interface of the channel (silicon) and the tunnel oxide film 111 and are injected into the tunnel oxide film 111. Subsequently, the electrons are caused to move inside the tunnel oxide film 111 by the electrical field $1\sim3\times10^8$V/m at the tunnel oxide film 111 and become trapped at the floating gate 113. Thus, the electrons, i.e. a negative charge is accumulated at the floating gate 113, to raise the threshold voltage of the transistor constituting the memory cell 102.

Electrons are injected into the floating gate 113 through the mechanism described above. Electrons are drawn out from the floating gate 113 in a manner similar to that employed in the flash memory 101 in the first embodiment.

As described above, the flash memory 301 in the third embodiment achieves a reduction in the size, a reduction in the power consumption and an improvement in the reliability with which it performs data write/data erase, as do the flash memories 101 and 201 in the first and second embodiments.

A so-called parasitic capacity is present between the $n^+$ diffusion area to constitute the source 116 and the P-type well 123, between the $n^+$ diffusion area to constitute the drain 117 and the P-type well 123 and between the P-type well 123 and the N-type well 122.

In the flash memory 101 in the first embodiment, a pulse voltage is applied to the P-type well 123 to inject electrons into the floating gate 113 of a given memory cell 102 and, as a result, a charge/discharge current attributable to the parasitic capacities (at the three locations) is generated at a rise and a fall of the pulse.

In contrast, in the flash memory 301 in the third embodiment in which are constant voltage is applied to the P-type well 123 and the N-type well 122 to inject electrons into the floating gate 113 of the memory cell 102, the parasitic capacity between the P-type well 123 and the N-type well 122 sustains a charged state. Thus, a charge/discharge current attributable to the parasitic capacities (at the two locations) between the $n^+$ diffusion area (the source 116) to which a pulse voltage is applied and the P-type well 123 and between the $n^+$ diffusion area (the drain 117) to which a pulse voltage is applied and the P-type well 123 is generated.

As described above, in the flash memory 301 in the third embodiment, the level of the charge/discharge current during an operation for injecting electrons into the floating gate 113 of the memory cell 102 is lowered to further reduce the power loss compared to the flash memory 101 in the first embodiment. In addition, since the length of time required for charge/discharge is reduced, as well, the frequencies of the pulse voltages output from the second internal source 332 and the fourth internal source 334 can be increased to reduce the length of time required to inject electrons into the floating gate 113.

The mechanism through which electrons are injected into the floating gate 113 in a given memory cell 102 among the plurality of memory cells 102-00~102-ij has been explained. This electron injection mechanism is employed in all the memory cells 102-00~102-ij. In addition, by constituting the flash memory 301 in the third embodiment as illustrated in FIG. 6, electrons can be injected into the floating gates of the individual memory cells 102-00~102-ij all at once.

In reference to FIG. 6, the connections of the individual memory cells 102-00~102-ij to their peripheral circuits in the flash memory 301 in the third embodiment are explained.

The sources of the memory cells 102-00~102-ij are commonly connected to the fourth internal source 334 via the source line SL.

The channels (P-type wells) of the memory cells 102-00~102-ij are commonly connected to the first internal source 231.

The drains of the memory cells 102-00~102-ij are connected to bit lines BL0~BLj. A bit line selection is made from the bit lines BL0~BLj by the column decoder 141. A selected bit line is connected to the second internal source 332 via the corresponding bit line driver among the bit line drivers 151-0~151-j.

The control gates of the memory cells 102-00~102-ij are connected to word lines WL0~WLi. A word line selection is made from the word lines WL0~WLi by the row decoder 142. A selected word line is connected to the third internal source 133 via the corresponding word line driver among the word line drivers 152-0~152-i.

By selecting all the memory cells 102-00~102-ij with the column decoder 141 and the row decoder 142 in the flash memory 301 structured as described above, electrons are injected into the floating gates of the individual memory cells 102-00~102-ij through the mechanism illustrated in FIG. 7 to raise the threshold voltages of the transistors constituting the memory cells 102-00~102-ij at once. For instance, if the flash memory 301 is a type that erases stored data by raising the threshold voltages of the transistors constituting the memory cells 102-00~102-ij to a specific level, the circuit structure illustrated in FIG. 6 may be adopted to erase data stored in all the memory cells 102-00~102-ij in a batch.

(Fourth Embodiment)

A flash memory 401 in the fourth embodiment of the present invention is provided with a memory cell array constituted of a plurality of stacked type memory cells 102-00~102-ij, as is the flash memory 101 in the first embodiment.

Figure 8A:
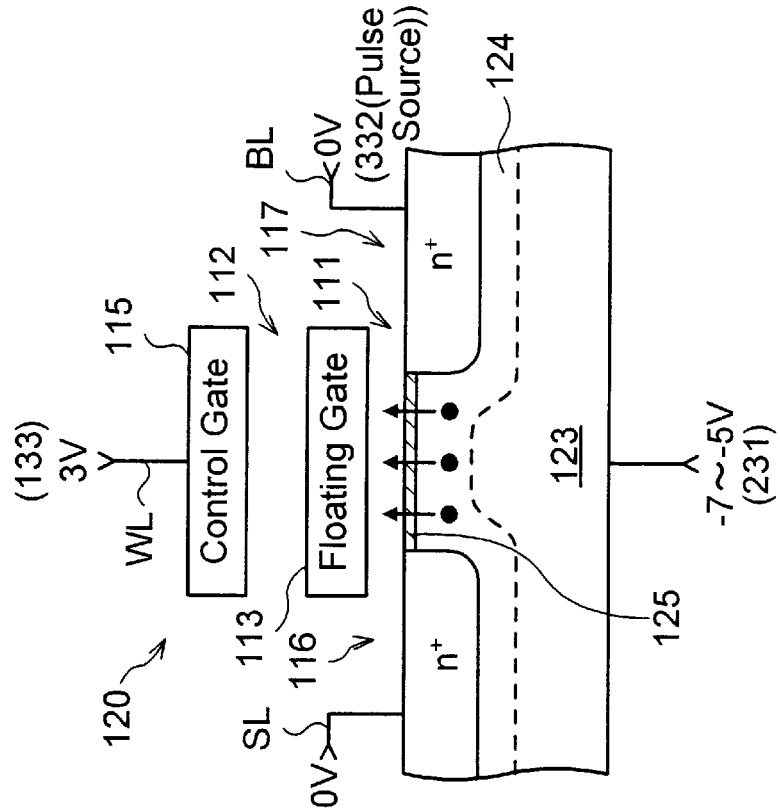
FIG. 8, consisting of FIGS. 8A and 8B, is a sectional view of a memory cell provided in the flash memory in a fourth embodiment of the present invention.
Figure 8B:
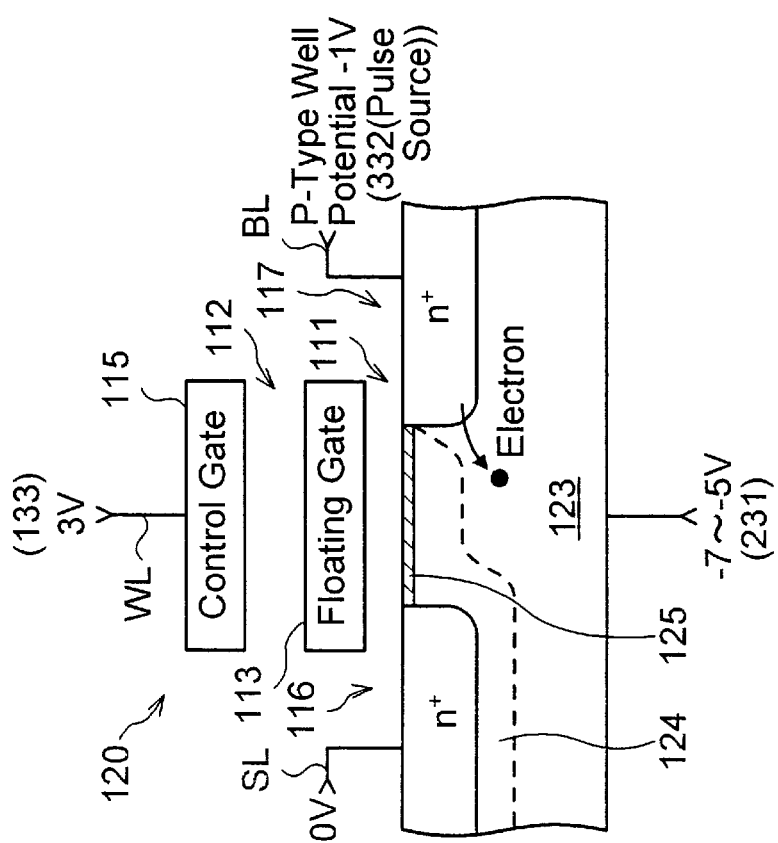

In the flash memory 401, various voltages (to be detailed later) are applied to individual components of the memory cells 102-00~102-ij to inject electrons into the floating gates of the individual memory cells 102-00~102-ij. The various voltages applied to a given memory cell 102 among the memory cells 102-00~102-ij and the injection mechanism through which electrons are injected into the floating gate 113 of the memory cell 102 are now explained in reference to FIG. 8.

A constant voltage at $-5 \sim -7V$ is applied to the P-type well 123 from the first internal source 231.

A pulse voltage is applied to the drain 117 from the second internal source 332 via the bit line BL.

A 3V voltage (if the coupling rate is approximately 0.7) is applied to the control gate 115 from the third internal source 133 via the word line WL so as to generate a $1 \sim 3 \times 10^8 V/m$ electrical field at the tunnel oxide film 111.

0V (ground GND voltage) is applied to the source 116.

The pulse voltage output from the second internal source 332 and applied to the drain 117, the frequency of which is set at approximately 1 MHz, is adjusted to swing between a voltage which is lower than the voltage applied to the P-type well 123 by approximately 1V ($-8V$ if $-7V$ is applied to the P-type well 123) and 0V.

First, let us consider a situation in which the potential at the drain 117 is lowered to a level lower than the potential at the P-type well 123 by 1V by the pulse voltage output from the second internal source 332. In this situation, the pn junction between the drain 117 and the P-type well 123 is set in a forward bias state. As a result, electrons (minority carriers) are injected from the drain 117 into the channel (P-type well 123) (see FIG. 8(a)).

Then, as the potential the at the drain 117 is raised to 0V by the pulse voltage output from the second internal source 332, the depletion layer 124 spreads over the entire range in the lower portion of the channel. The electrons injected from the drain 117 into the channel become accelerated at the depletion layer 124 toward the tunnel oxide film 111 (see FIG. 8(b)).

An inversion layer 125 having manifested at the channel surface sets the potential at the channel surface equal to the potentials at the source 116 and the drain 117, i.e., 0V at this time. Assuming that the film thickness of the tunnel oxide film 111 is 9 nm and the coupling rate is 0.7, the electrical field generated at the tunnel oxide film 111 is $1 \sim 3 \times 10^8 V/m$ with the potential at the control gate 115 adjusted at 3V. In addition, since there is no difference between the potential at the source 116 and the potential at the drain 117, no current flows between them (carriers do not move).

The electrons accelerated in the channel gain enough energy to overcome the energy barrier present at the interface of the channel (silicon) and the tunnel oxide film 111 and are injected into the tunnel oxide film 111. Subsequently, the electrons are caused to move inside the tunnel oxide film 111 by the electrical field $1 \sim 3 \times 10^8 V/m$ at the tunnel oxide film 111 and become trapped at the floating gate 113. Thus, the electrons, i.e. a negative charge is accumulated at the floating gate 113, to raise the threshold voltage of the transistor constituting the memory cell 102.

Electrons are injected into the floating gate 113 through the mechanism described above. Electrons are drawn out from the floating gate 113 in a manner similar to that employed in the flash memory 101 in the first embodiment.

As described above, though flash memory 401 in the fourth embodiment achieves a reduction in the size, a reduction in the power consumption and an improvement in the reliability with which it performs data write/data erase, as do the flash memories 101, 201 and 301 in the first, second and third embodiments.

In the flash memory 301 in the third embodiment, a charge/discharge current attributable to the parasitic capacities (two locations) between the $n^+$ diffusion area (source 116) and the P-type well 123 and between the $n^+$ diffusion area (drain 117) and the P-type well 123 is generated since the pulse voltages are applied to the source 116 and the drain 117 to inject electrons into the floating gate 113 of the memory cell 102.

In the flash memory 401 in the fourth embodiment in which a constant voltage is applied to the source 116 to inject electrons into the floating gate 113 of the memory cell 102, the parasitic capacity between the $n^+$ diffusion area (source 116) and the P-type well 123 sustains a charged state. Thus, charge/discharge current attributable to the parasitic capacity (at one location) between the $n^+$ diffusion area (drain 117) to which the pulse voltage is applied and the P-type well 123 is generated.

As described above, in the flash memory 401 in the fourth embodiment, the level of the charge/discharge current during an operation for injecting electrons into the floating gate 113 of the memory cell 102 is lowered to further reduce the power loss compared to the flash memory 301 in the third embodiment. In addition, since the length of time required for charge/discharge is reduced, the frequency of the pulse voltage output from the second internal source 332 can be increased to reduce the length of time required to inject electrons into the floating gate 113.

In addition, the flash memory 401 in the fourth embodiment achieves the following advantages. In the flash memory 401, in which a constant voltage is applied to the P-type well 123 and a pulse voltage is applied to the drain 117 during an operation for injecting electrons into the floating gate 113 of the memory cell 102, the pn junction between the P-type well 123 and the drain 117 is regularly set in a reverse bias state. When this happens, the range of the depletion layer 124 is expanded to the area under the drain 117. In the flash memory 201 in the second embodiment, on the other hand, with constant voltages applied to the P-type well 123 and the drain 117 during an operation for injecting electrons into the floating gate 113 of the memory cell 102, the pn junction between the P-type well 123 and the drain 117 is fixed in a forward bias state. As a result, the range of the depletion layer 124 does not expand to the area near the drain 117, as illustrated in FIG. 4.

Since electrons in the channel are accelerated at the depletion layer 124 toward the tunnel oxide film 111, a higher degree of injection efficiency is achieved in the flash memory 401 in the fourth embodiment achieving a larger depletion layer 124 to inject electrons into the tunnel oxide film 111, compared to the efficiency achieved in the flash memory 201 in the second embodiment as well as the efficiency achieved in the flash memory 1 in the prior art. This advantage is also realized in the flash memory 101 in the first embodiment (see FIG. 3(b)) and the flash memory 301 in the third embodiment (see FIG. 7(b)) both having a larger a depletion layer 124.

As described above, the flash memory 401 in the fourth embodiment is provided with a plurality of memory cells 102-00~102-ij. The flash memory 401 in the fourth embodiment makes it possible to inject electrons into the floating gates of the individual memory cells 102-00~102-ij all at once, as does the flash memory 101 in the first embodiment. In addition, by assuming the structure shown in FIG. 9 in the flash memory 401, one or more memory cells may be selected from the memory cells 102-00~102-ij to inject electrons into the floating gates of the selected memory cells.

Figure 9:
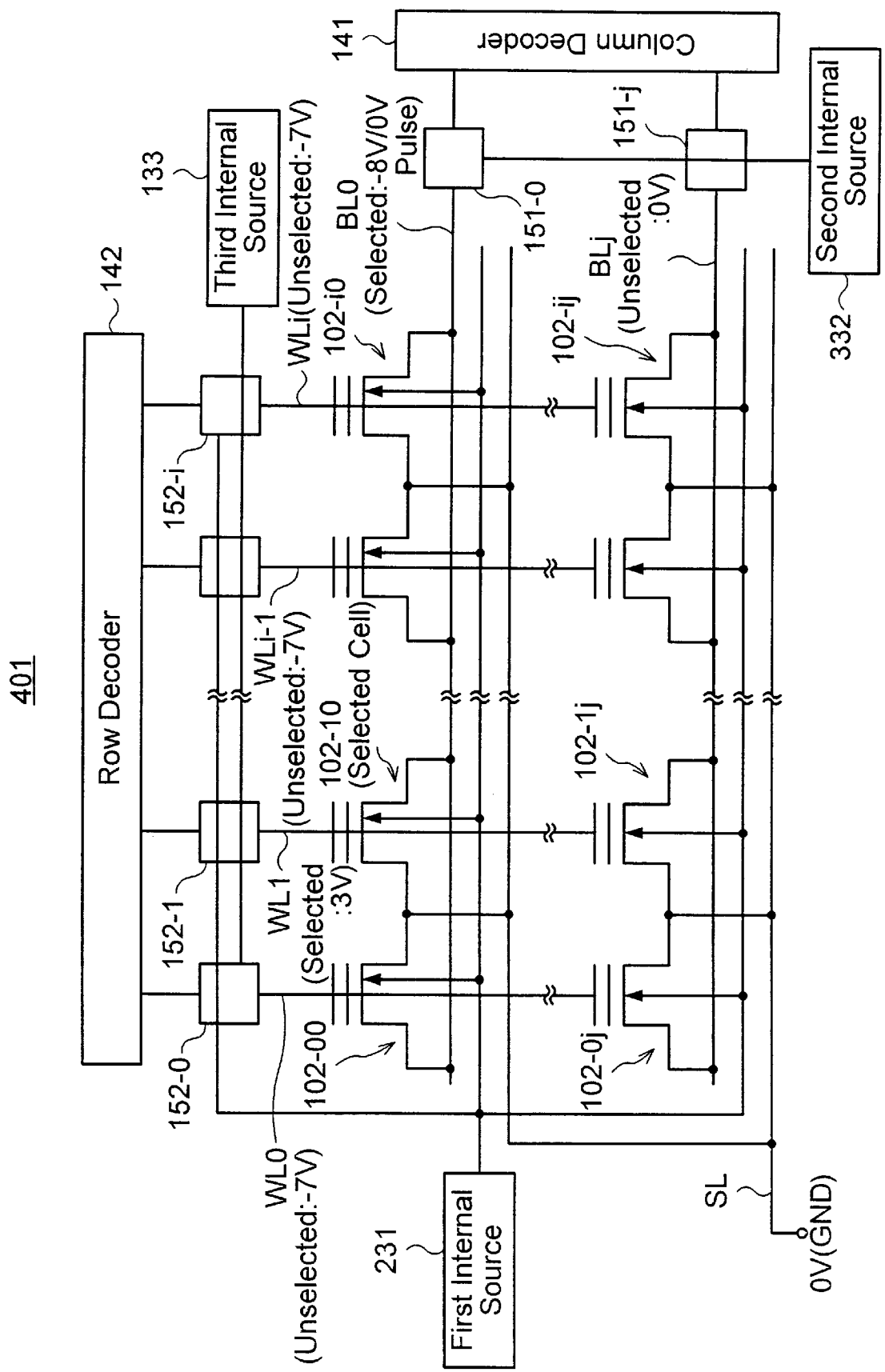
FIG. 9 is a circuit block diagram illustrating the structure of the flash memory in the fourth embodiment of the present invention.

In reference to FIG. 9, the connections of the individual memory cells 102-00~102-ij to their peripheral circuits in the flash memory 401 in the fourth embodiment are explained.

The sources of the memory cells 102-00~102-ij are commonly connected to the ground GND (0V) via the source line SL.

The channels (P-type wells) of the memory cells 102-00~102-ij are commonly connected to the first internal source 231.

The drains of the memory cells 102-00~102-ij are connected to bit lines BL0~BLj. A bit line selection is made from the bit lines BL0~BLj by the column decoder 141. A selected bit line is connected to the second internal source 332 via the corresponding bit line driver among the bit line drivers 151-0~151-j. Bit lines that have not been selected (unselected bit lines), on the other hand, are connected to the ground GND (0V) via the bit line drivers 151-0~151-j.

The control gates of the memory cells 102-00~102-ij are connected to word lines WL0~WLi. A word line selection is made from the word lines WL0~WLi by the row decoder 142. A selected word line is connected to the third internal source 133 via the corresponding word line driver among the word line drivers 152-0~152-i. The word lines that have not been selected (unselected word lines), on the other hand, are connected to the first internal source 231 via the word line drivers 152-0~152-i.

Now, the operations achieved in the individual memory cells 102-00~102-ij when the bit line BL0 is selected by the column decoder 141 and the word line WL1 is selected by the row decoder 142 in order to inject electrons into the floating gate of the memory cell 102-10, for instance, in the flash memory 401 structured as described above are explained.

First, the operation of the memory cell 102-10 (selected memory cell) at the address specified by the selected bit line, i.e., the bit line BL0, and the selected word line, i.e., the word line WL1, is explained.

A voltage of 0V (ground GND voltage) is applied to the source of the memory cell 102-10 via the source line SL whereas −7V output from the first internal source 231 is applied to the channel (P-type well) of the memory cell 102-10. Since the row decoder 142 has selected the word line WL1, 3V output from the third internal source 133 is applied to the control gate of the memory cell 102-10 connected to the word line WL1 via the word line driver 152-1 and the word line WL1. In addition, with the bit line BL0 having been selected by the column decoder 141, a pulse voltage output from the second internal source 332 is applied to the drain of the memory cell 102-10 connected to the bit line BL05 via the bit line driver 151-0 and the bit line BL0. It is to be noted that the pulse voltage output from the second internal source 332, the frequency of which is set at approximately 1 MHz, is adjusted so as to swing between a voltage lower than the voltage output from the first internal source 231 by approximately 1V (−8V if the voltage output from the first internal source 231 is −7V) and 0V, as explained earlier.

With specific voltages applied to individual components thereof, as described above, the memory cell 102-10 engages in an operation similar to that performed by the memory cell 102 shown in FIG. 8. Namely, in the memory cell 102-10, electrons are injected from its drain to its channel, and the electrons thus injected are accelerated at the depletion layer. Then, the electrons gain enough energy to overcome the energy barrier present at the interface of the channel and the tunnel oxide film and are injected into the tunnel oxide film. Subsequently, the electrons travel inside the tunnel oxide film due to the presence of the electrical field $1\sim3\times10^8$ V/m at the tunnel oxide film to become trapped at the floating gate. Thus, the electrons, i.e., a negative charge is accumulated at the floating gate of the memory cell 102-10 to raise the threshold voltage of the transistor constituting the memory cell 102-10.

Next, the operations of the memory cells (unselected memory cells) other than the selected memory cell, i.e., the memory cell 102-10, are explained.

The unselected memory cells are divided into three groups, i.e., (1) memory cells each connected to the selected bit line and an unselected word line, (2) memory cells each connected to an unselected bit line and the selected word line and (3) memory cells each connected to an unselected bit line and an unselected word line. The operations of the unselected memory cells in these three groups are now individually explained.

The memory cells in group (1) include, for instance, the memory cell 102-i0. A voltage of 0V (ground GND voltage) is applied to the source of the memory cell 102-i0 via the source line SL, whereas −7V output from the first internal source 231 is applied to the channel (P-type well) of the memory cell 102-i0. Since the word line WLi has not been selected by the row decoder 142, −7V output from the first internal source 231 is applied to the control gate of the memory cell 102-i0 connected to the word line WLi via the word line driver 152-i and the word line WLi. Since the bit line BL0 has been selected by the column decoder 141, a pulse voltage output from the second internal source 332 is applied to the drain of the memory cell 102-i0 connected to the bit line BL0 via the bit line driver 151-0 and the bit line BL0.

In this memory cell 102-i0, electrons are injected from its drain to its channel as in the selected memory cell, i.e., the memory cell 102-10. However, with −7V output from the first internal source 231 applied to its control gate and channel, the control gate and the channel achieve potentials equal to each other. As a result, no electrical field directed toward the floating gate is generated at the tunnel oxide film, and even if electrons are injected from the channel to the tunnel oxide film, the electrons do not move toward the floating gate. Thus, no electrons, i.e., no negative charges, are injected to the floating gate of the memory cell 102-i0, and the threshold voltage of the transistor constituting the memory cell 102-i0 remains unchanged.

The memory cells in group (2) include, for instance, the memory cell 102-1j. A voltage of 0V (ground GND voltage) is applied to the source of the memory cell 102-1j via the source line SL, whereas −7V output from the first internal source 231 is applied to the channel (P-type well) of the memory cell 102-ij. Since the word line WL1 has been selected by the row decoder 142, 3V output from the third internal source 133 is applied to the control gate of the memory cell 102-1j connected to the word line WL1 via the word line driver 152-1 and the word line WL1. Since the bit line BLj has not been selected by the column decoder 141, 0V is applied to the drain of that memory cell 102-1j connected to the bit line BLj via the bit line driver 151-j and the bit line BLj.

In the memory cell 102-1j, an electrical field $1\sim3\times10^8$V/m is generated at the tunnel oxide film as in the selected memory cell, i.e., the memory cell 102-10. However, since the drain and the channel sustain a reverse bias at all times, the electrons to be injected into the floating gate are not injected from the drain to the channel in the first place. As a result, no electrons, i.e., no negative charges, are injected into the floating gate of the memory cell 102-1j, and the threshold voltage of the transistor constituting the memory cell 102-1j remains unchanged.

The memory cells in group (3) include, for instance, the memory cell 102-ij. 0V (ground GND voltage) is applied to the source of the memory cell 102-ij via the source line SL, whereas −7V output from the first internal source 231 is applied to the channel (P-type well) of the memory cell 102-ij. Since the word line WLi has not been selected by the row decoder 142, −7V output from the first internal source 231 is applied to the control gate of the memory cell 102ij via the word line driver 152i and the word line WLi. Since the bit line BLj has not been selected by the column decoder 141 either, 0V is applied to the drain of the memory cell 102-ij connected to the bit line BLj via the bit line driver 151-j and the bit line BLj.

In this memory cell 102-ij, a sustained reverse bias is achieved between the drain and the channel and, as a result, electrons to be injected into the floating gate are not injected from the drain to the channel in the first place. In addition, −7V output from the first internal source 231 is applied to the control gate and the channel, thereby setting the control gate and the channel at potentials equal to each other and, as a result, no electrical field directed toward the floating gate is generated at the tunnel oxide film. Thus, no electrons, i.e., no negative charges, are injected into the floating gate of the memory cell 102-ij, and the threshold voltage of the transistor constituting the memory cell 102-ij remains unchanged.

As described above, the flash memory 401 in the fourth embodiment allows a single memory cell (e.g., the memory cell 102-10) to be selected from the plurality of memory cells 102-00~102-ij so that electrons are injected only into the floating gate of the selected memory cell. In addition, the flash memory 401 in the fourth embodiment allows a plurality of memory cells corresponding to a given bit line or a given word line or all the memory cells to be selected. In any of these cases, electrons are injected into the floating gate of a selected memory cell alone, and no electrons are injected into the floating gates of unselected memory cells. For instance, if the flash memory 401 is a type of memory in which data are written by raising the threshold voltages of the transistors constituting the individual memory cells 102-00~102-ij to a specific level, the circuit structure illustrated in FIG. 9 may be adopted to enable a data write only at a specific memory cell.

It is to be noted that the electrons may be drawn out of the floating gates of the individual memory cells all at once in the flash memory 401 in the fourth embodiment by applying a negative voltage to the control gates of the memory cells and applying 0V (ground GND voltage) to the drains, the sources and the channels (P-type wells), so that the threshold voltages of the transistors constituting the memory cells are lowered to a specific level. For instance, if the flash memory 401 is a type of memory in which stored data at the memory cells 102-00~102-ij are erased by lowering the threshold voltages of the transistors constituting the memory cells to a specific level, the circuit structure shown in FIG. 9 may be adopted to enable batch erasure of data stored in all the memory cells 102-00~102-ij.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the embodiments of the present invention are explained on examples in which the invention is adopted in a flash memory, the present invention is not restricted by these particulars, and may be adopted in an EEPROM.

As explained above, according to the present invention, a reduction in the size of memory cells is achieved. In addition, erroneous write/read of data is prevented and a reduction in power consumption is realized.

The entire disclosure of Japanese Patent Application No. 2000-167070 filed on Jun. 5, 2000 including specification, claims, drawings and summary is incorporated herein by reference in its entirety.

What is claimed is:

1. A semiconductor memory system having a plurality of memory cells which is formed in a semiconductor substrate and a decoder that selects one or more memory cells from said plurality of memory cells, wherein;

said memory cells each comprise;
a channel portion formed in said substrate;
a source portion formed in said substrate;
a drain portion formed in said substrate;
a control gate portion; and
a floating gate portion which is in an electrically suspended state between said channel portion and said control gate portion; and
a reference voltage is applied to said source portion, said reference voltage is applied to said drain portion, a first voltage achieving a level higher than said reference voltage is applied to said control gate portion and a second voltage achieving a level higher than said reference voltage but lower than said first voltage and a third voltage achieving a level lower than said reference voltage are alternately applied to said channel portion, at each selected memory cell selected from said plurality of memory cells by said decoder.

* * * * *